(12) United States Patent
Lee et al.

(10) Patent No.: US 6,604,219 B1
(45) Date of Patent: Aug. 5, 2003

(54) DC CONTROL OF A MULTILEVEL SIGNAL

(75) Inventors: David C. Lee, Zhanjiang (CN); John L. Fan, Palo Alto, CA (US); Yung-Cheng Lo, San Leandro, CA (US)

(73) Assignee: Calimetrics, Inc., Alameda, CA (US)

( * ) Notice: Subject to any disclaimer, the term of this patent is extended or adjusted under 35 U.S.C. 154(b) by 0 days.

(21) Appl. No.: 09/496,897

(22) Filed: Feb. 2, 2000

(51) Int. Cl.[7] .................. H03M 5/20; G11B 20/10; G11B 20/14
(52) U.S. Cl. ................. 714/769; 341/56; 341/58
(58) Field of Search ................ 714/769; 341/56, 341/58, 59

(56) References Cited

U.S. PATENT DOCUMENTS

| | | | | |
|---|---|---|---|---|
| 4,408,189 A | | 10/1983 | Betts et al. ................ 340/347 |
| 4,476,495 A | * | 10/1984 | Fujisawa et al. ............ 382/245 |
| 5,375,249 A | | 12/1994 | Cho ........................ 395/800 |
| 5,450,443 A | * | 9/1995 | Siegel et al. ............... 375/286 |
| 5,537,382 A | * | 7/1996 | McLaughlin et al. ...... 369/59.24 |
| 5,719,614 A | | 2/1998 | Liedenbaum et al. ....... 347/247 |
| 5,748,119 A | | 5/1998 | Ko ........................... 341/59 |
| 5,828,754 A | | 10/1998 | Hogan ....................... 380/49 |
| 6,023,234 A | | 2/2000 | Fukuoka .................... 341/58 |
| 6,150,964 A | * | 11/2000 | McLaughlin ................ 341/59 |
| 6,362,754 B1 | * | 3/2002 | Van Dijk et al. ............ 341/59 |
| 6,404,355 B1 | * | 6/2002 | Coene ....................... 341/59 |
| 6,456,208 B1 | * | 9/2002 | Nazari et al. ............... 341/59 |

* cited by examiner

*Primary Examiner*—Stephen M. Baker
(74) *Attorney, Agent, or Firm*—Van Pelt & Yi LLP (57) ABSTRACT

A system and method are disclosed for writing a multilevel data sequence to a storage medium so that a read signal generated by reading the multilevel data sequence from the storage medium will have reduced low frequency content is described. The method includes evaluating the effect of a plurality of candidate merge symbols on an RDS of the read signal. A preferred merge symbol is selected from among the plurality of candidate merge symbols based on the effect of the preferred merge symbol on an RDS of the read signal. The preferred merge symbol is added to the multilevel data sequence so that the RDS of the read signal is controlled.

25 Claims, 13 Drawing Sheets

| 222 | 220 | 222 | 220 |

[DCC Field] [Data Field] [DCC Field] [Data Field]
    I           N            I           N

| | | | | | | |
|---|---|---|---|---|---|---|
| Input $a_k$ | 0 | 1 | 7 | 5 | 4 | |
| Encoded output bk | 6 | 6 | 7 | 6 | 3 | 7 |
| Channel output ck | 6 | 6 | 7 | 6 | 3 | 7 |
| Differential decoder output dk | | 0 | 1 | 7 | 5 | 4 |

Figure 4A

| | | | | | | |
|---|---|---|---|---|---|---|
| Input $a_k$ | 0 | 1 | 7 | 5 | 4 | |
| Pre-encoded output bk | 6 | 2 | 7 | 0 | 5 | 7 |
| Channel output ck | 8 | 9 | 7 | 5 | 12 | |
| Differential decoder output $d_k$ | 0 | 1 | 7 | 5 | 4 | |

No. of Levels M : 4
Previous Output : 0
Input Block : 0132
Current RDS : -2

Candidate Merge Symbol :0

| | | | | | | | | |
|---|---|---|---|---|---|---|---|---|
| $a_k$ | | 0 | 0 | 1 | 3 | 2 | | |
| $b_k$ | 0 | 0 | 0 | 1 | 0 | 2 | Ending \|RDS\| : | 11 |
| $DV(b_k)$ | | -3 | -3 | -1 | -3 | +1 | Max \|RDS\| : | 12 |
| RDS | -2 | -5 | -8 | -9 | -12 | -11 | | |

Candidate Merge Symbol :1

| | | | | | | | | |
|---|---|---|---|---|---|---|---|---|
| $a_k$ | | 1 | 0 | 1 | 3 | 2 | | |
| $b_k$ | 0 | 1 | 1 | -2 | 1 | 3 | Ending \|RDS\| : | 1 |
| $DV(b_k)$ | | -3 | -1 | -1 | +1 | -1 | -3 Max \|RDS\| : | 4 |
| RDS | -2 | -3 | -4 | -3 | -4 | -7 | | |

Candidate Merge Symbol :2

| | | | | | | | | |
|---|---|---|---|---|---|---|---|---|
| $a_k$ | | 2 | 0 | 1 | 3 | 2 | | |
| $b_k$ | 0 | 2 | 2 | 3 | 2 | 0 | Ending \|RDS\| : | 1 |
| $DV(b_k)$ | | -3 | +1 | +1 | +3 | +1 | -3 Max \|RDS\| : | 4 |
| RDS | -2 | -1 | 0 | +3 | +4 | +1 | | |

Candidate Merge Symbol :3

| | | | | | | | | |
|---|---|---|---|---|---|---|---|---|
| $a_k$ | | 3 | 0 | 1 | 3 | 2 | | |
| $b_k$ | 0 | 3 | 3 | 0 | 3 | 1 | Ending \|RDS\| : | 3 |
| $DV(b_k)$ | | -3 | +3 | +3 | -3 | +3 | -1 Max \|RDS\| : | 4 |
| RDS | -2 | +1 | +4 | +1 | +4 | -13 | | |

[DCC Field] [DCC Field] - - - - [DCC Field] [Data Field] [Data Field]

No. of Levels     N  :  4
No. of DCC Levels     L  :  2
Input Block  :  0132
Current RDS  :  -2

Candidate Merge Symbol :   0    (Do not invert)

| | | | | | | | | |
|---|---|---|---|---|---|---|---|---|
| $a_k$ | | 0 | 0 | 1 | 3 | 2 | | |
| $b_k$ | | 0 | 0 | 1 | 3 | 2 | Ending \|RDS\| : | 5 |
| $DV(b_k)$ | | -3 | -3 | -1 | -3 | +1 | Max    \|RDS\| : | 9 |
| RDS | -2 | -5 | -8 | -9 | -6 | -5 | | |

Candidate Merge Symbol :   3    (Invert)

| | | | | | | | | |
|---|---|---|---|---|---|---|---|---|
| $a_k$ | | 3 | 0 | 1 | 3 | 2 | | |
| $b_k$ | | 3 | 3 | 2 | 0 | 1 | Ending \|RDS\| : | 1 |
| $DV(b_k)$ | | +3 | +3 | +1 | -3 | -1 | Max    \|RDS\| : | 5 |
| RDS | -2 | +1 | +4 | +5 | +2 | +1 | | |

DC CONTROL OF A MULTILEVEL SIGNAL

This invention was made with United States Government support by the U.S. Department of Commerce through the NSIC/MORE program under cooperative agreement number 70NANB7H3054. The United States Government has certain rights in this invention.

FIELD OF THE INVENTION

The present invention relates generally to processing signals for storage on a data storage medium such as an optical disc. More specifically, DC control for a multilevel signal is disclosed.

BACKGROUND OF THE INVENTION

Commercial optical data storage systems, such as CD-ROM and DVD-ROM, use binary recording levels to store information. In general, reading data stored on an optical disc may result in a binary read signal containing significant DC and low frequency components. In this specification, DC and low frequency components will be collectively referred to as low frequency components and DC control will be used to refer to the control of low frequency components, as well as DC components. Such low frequency components interfere with servo-motor controls that are used to position the read head in the optical drive. Therefore, some type of line coding is provided in most systems to control the DC and low-frequency content of the binary signal that is written to and read from the disc.

Figure 1A:
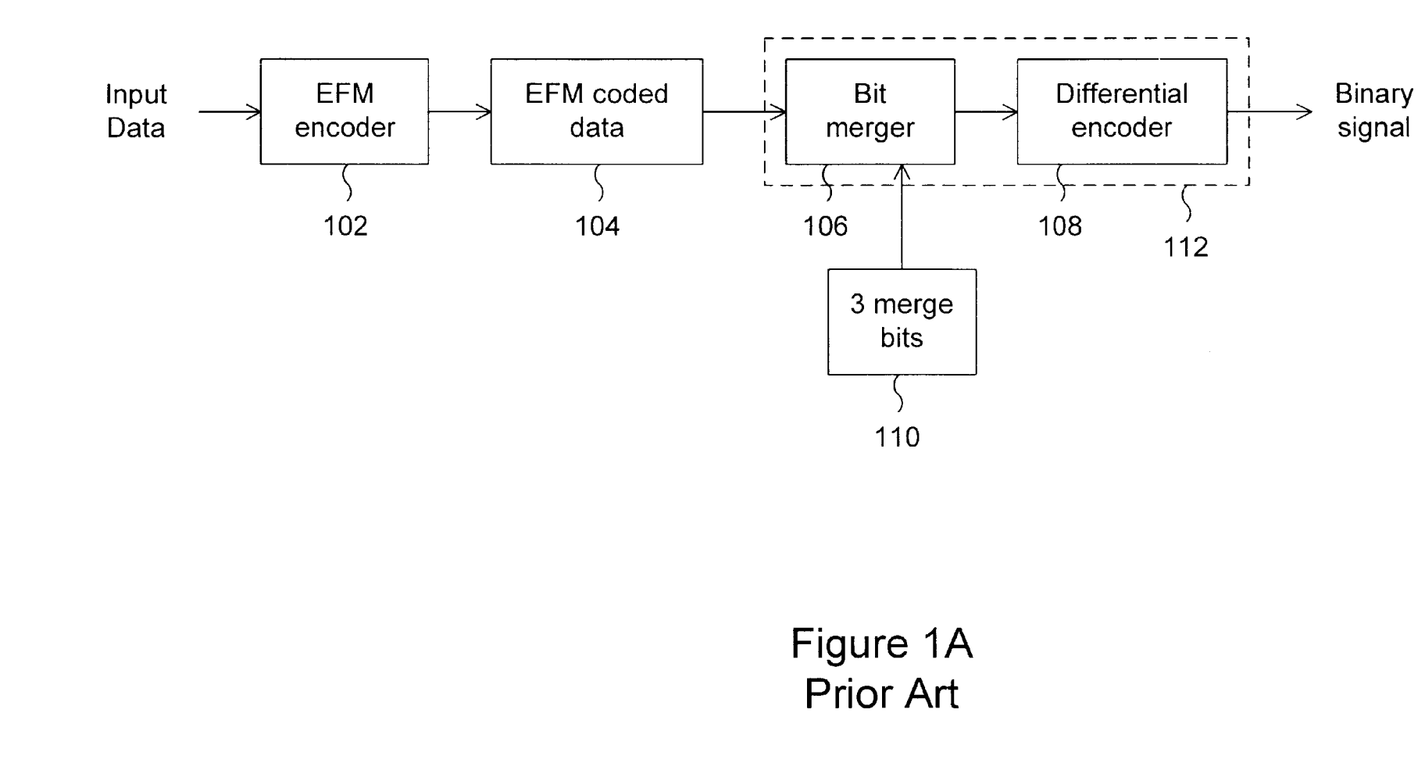
FIG. 1A is a block diagram illustrating an encoding system using EFM.

In CD-ROM and related families (CD-R, CD-RW, etc.), user data is encoded with Eight to Fourteen Modulation (EFM) code to provide run-length limits (RLL) and DC control (DCC). FIG. 1A is a block diagram illustrating an encoding system using EFM. An EFM encoder 102 encodes each byte (eight bits) of user data 100 as a codeword 104 consisting of fourteen channel bits. A bit merger 106 inserts three "merge" or "glue" channel bits 110 between adjacent codewords to maintain RLL constraints across pairs of codewords and to provide DCC. A differential modulator 108 differentially encodes the channel bits into binary levels. The binary levels are represented as lands and pits on the surface of the optical disc by interpreting "one" channel bits as transitions from land to pit or vice versa, and "zero" channel bits as no transition.

Figure 1B:
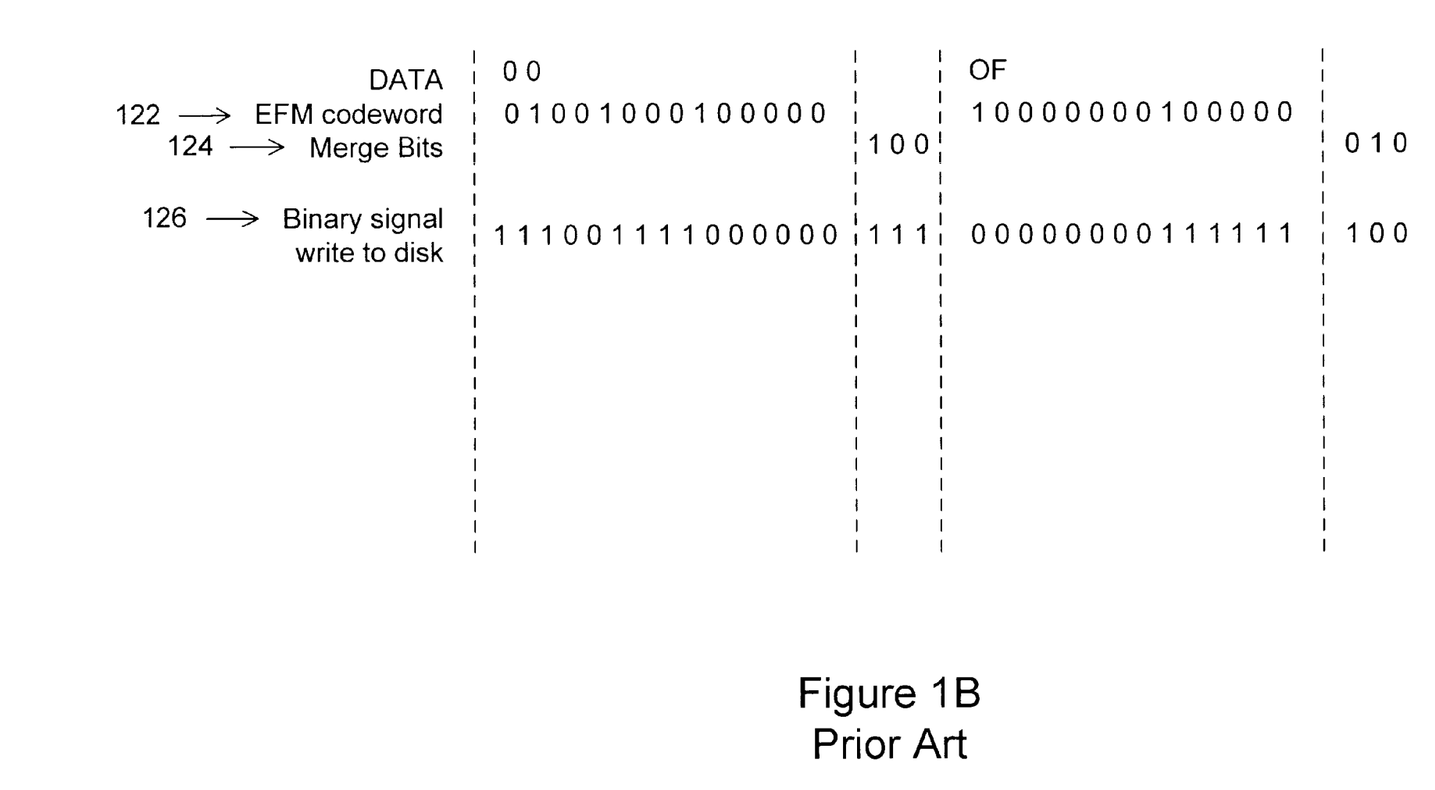
FIG. 1B is a diagram illustrating a data bit stream that is encoded using EFM and stored on a CD.

If the number of lands to be written is significantly larger than the number of pits, or vice versa, the DC content of the written signal becomes significant. The bit merger prevents that from happening by introducing a transition (i.e., a channel "one" merge bit), when necessary, to flip the following codeword, thus changing lands in that codeword to pits and vice versa. DCC encoder 112, which is shown encompassing the bit merger and differential modulator, determines whether or not to introduce such a transition. FIG. 1B is a diagram illustrating a data bit stream that is encoded using EFM and stored on a CD. Each 8 bit data byte 120 is converted to a 14 bit codeword 122. Merge bits 124 are added between codewords 122 to introduce transitions where necessary to balance out the number of pits and lands written to the disc. The binary signal written to the disc 126 transitions whenever a 1 is encountered in the channel code, which includes the 14 bit codewords and the merge bits. In the example shown, the 1 bit included at the beginning of the merge bits causes a majority of the next 17 bits to be ones, thus partially balancing the majority of zeros included in the first 14 bits.

Multilevel optical recording systems have been developed that increase the capacity and speed of optical data storage systems. The term multilevel refers to more than two levels. That is, multilevel optical recording systems include more than two possible levels or states for each location on the optical disc. The density of data recorded on an optical recording medium is increased over traditional optical recording systems that use binary recording by modulating the reflectivity of the optical recording medium among more than two states. Multilevel optical data storage systems, like binary systems, require DC control of the recorded signal to prevent low-frequency content from interfering with the servomotor controls.

The method of introducing or not introducing a single transition using the merge bits does not extend to multilevel signals that are modulated among more than two states. Multilevel channel symbols cause transitions of different magnitudes, or no transition for the channel symbol "zero." Moreover, some multilevel systems do not differentially encode the data, and channel symbols are directly mapped to the reflectivity level of the optical recording medium. What is needed is a scheme for providing DC control for multilevel systems.

SUMMARY OF THE INVENTION

A system and method for providing DC control for a multilevel system is disclosed. DC control is implemented for systems where input data is either differentially encoded or not differentially encoded. For a differential encoding system, DCC is implemented by selecting and inserting a merge symbol between blocks of data symbols before differential encoding. The merge symbol is chosen so that the resulting differentially encoded signal is DC-balanced. For a non-differential encoding system, DCC is implemented by selectively inverting blocks of data so that the resulting signal is DC-balanced. Merge symbols are selected and inserted between blocks of data symbols. The merge symbols specify whether or not the following block of data is inverted. On the read side, the merge symbols are decoded to determine which blocks of symbols were inverted so that the blocks may be restored to their original state when necessary.

It should be appreciated that the present invention can be implemented in numerous ways, including as a process, an apparatus, a system, a device, a method, or a computer readable medium such as a computer readable storage medium or a computer network wherein program instructions are sent over optical or electronic communication links. Several inventive embodiments of the present invention are described below.

In one embodiment, a method of writing a multilevel data sequence to a storage medium so that a read signal generated by reading the multilevel data sequence from the storage medium will have reduced low frequency content is described. The method includes evaluating the effect of a plurality of candidate merge symbols on an RDS of the read signal. A preferred merge symbol is selected from among the plurality of candidate merge symbols based on the effect of the preferred merge symbol on an RDS of the read signal. The preferred merge symbol is added to the multilevel data sequence so that the RDS of the read signal is controlled.

In one embodiment, A DC control encoder in a system for writing a multilevel data sequence to a storage medium includes a processor configured to evaluate the effect of a plurality of candidate merge symbols on an RDS of the read signal and to select a preferred merge symbol from among the plurality of candidate merge symbols based on the effect of the preferred merge symbol on an RDS of a read signal.

A bit merger is configured to add the preferred merge symbol to the multilevel data sequence so that the RDS of the read signal is controlled. The resulting read signal generated by reading the multilevel data sequence from the storage medium has reduced low frequency content.

In one embodiment, a storage medium has multilevel data written to the storage medium so that a read signal generated by reading the multilevel data sequence from the storage medium has a reduced low frequency content. The data sequence is written by evaluating the effect of a plurality of candidate merge symbols on an RDS of the read signal and selecting a preferred merge symbol from among the plurality of candidate merge symbols based on the effect of the preferred merge symbol on an RDS of the read signal. The preferred merge symbol is added to the multilevel data sequence so that the RDS of the read signal is controlled.

These and other features and advantages of the present invention will be presented in more detail in the following detailed description and the accompanying figures which illustrate by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION

A detailed description of a preferred embodiment of the invention is provided below. While the invention is described in conjunction with that preferred embodiment, it should be understood that the invention is not limited to any one embodiment. On the contrary, the scope of the invention is limited only by the appended claims and the invention encompasses numerous alternatives, modifications and equivalents. For the purpose of example, numerous specific details are set forth in the following description in order to provide a thorough understanding of the present invention. The present invention may be practiced according to the claims without some or all of these specific details. For the purpose of clarity, technical material that is known in the technical fields related to the invention has not been described in detail in order not to unnecessarily obscure the present invention.

Figure 2A:
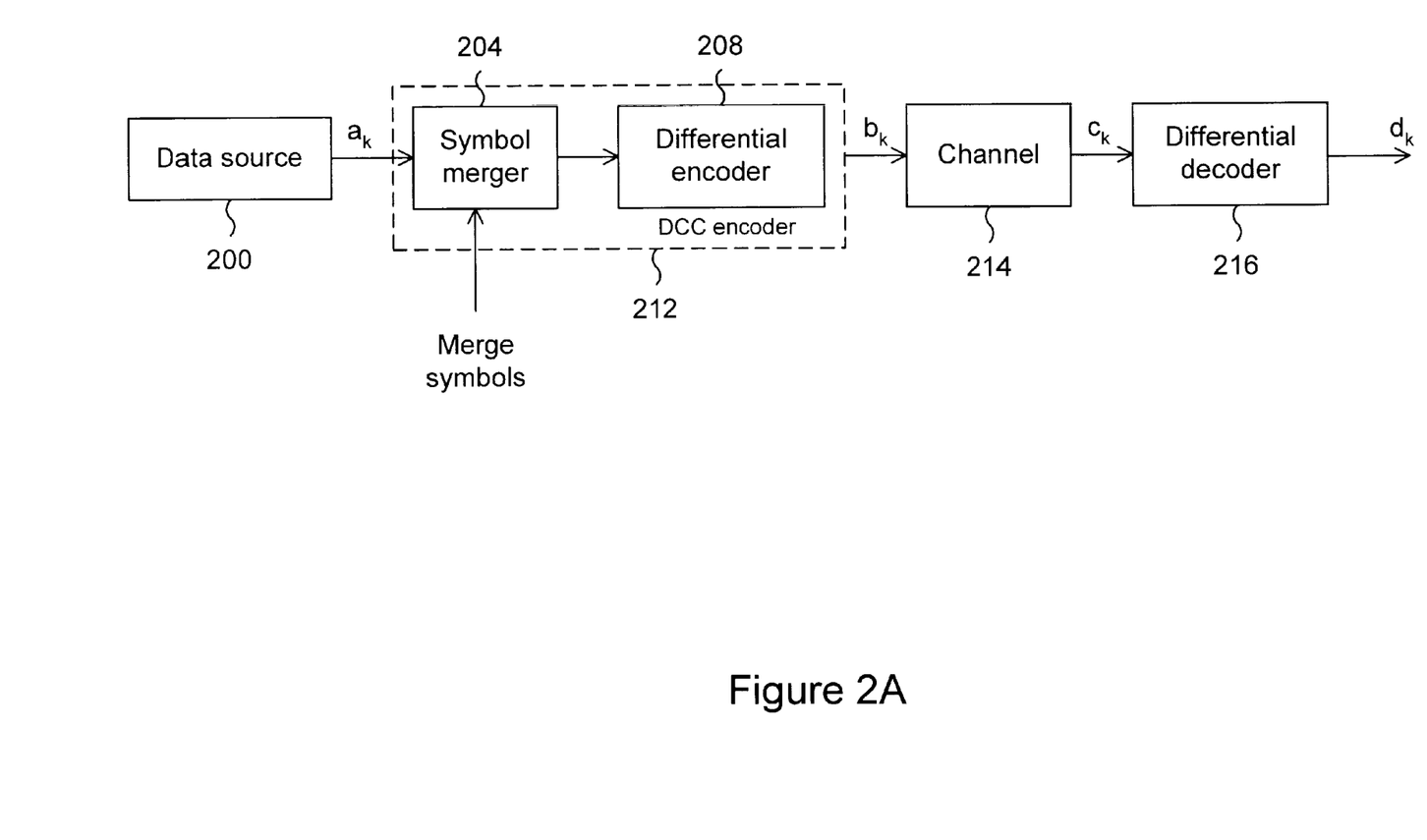
FIG. 2A is a block diagram illustrating a differentially encoded system with DCC.

In one embodiment, DCC is implemented on a differentially encoded multilevel signal. FIG. 2A is a block diagram illustrating a differentially encoded system with DCC. A data source 200 provides a stream of multilevel symbols $a_k$ comprising a sector of user data to be written to the disc. This data stream may be encoded, for example, by a trellis encoder. One such encoding scheme is described in U.S. patent application Ser. No. 09/369,746, filed Aug. 6, 1999, entitled "Coding System and Method for Partial Response Channels," which is herein incorporated by reference. A symbol merger 204 divides the input sector into blocks of length N symbols and inserts a merge symbol in front of each block. In one embodiment, symbol merger 204 is a multiplexer.

A differential encoder 208 differentially encodes the resulting merged stream to produce a stream of multilevel symbols $b_k$ that are written directly to the disk. Symbol merger 204 and differential encoder 208 together comprise a DCC encoder 212. DCC encoder 212 also includes a processor that selects the best merge symbol for providing DCC. After the merge symbols are added, differential encoder 208 differentially encodes the signal. Channel 214 represents the combination of writing to and reading from the disk, as well as the accompanying analog and digital processing that equalizes the combined response to the target response appropriate for the type of differential encoding used.

A differential decoder 216 takes the channel signal $c_k$ and outputs a decoded signal $d_k$, which, in the absence of noise or other errors, is identical to the original signal, $a_k$. Since the merge symbols do not contain any information, there is no DCC decoder, per se, on the read side. The read side simply ignores the merge symbols.

Figure 2B:
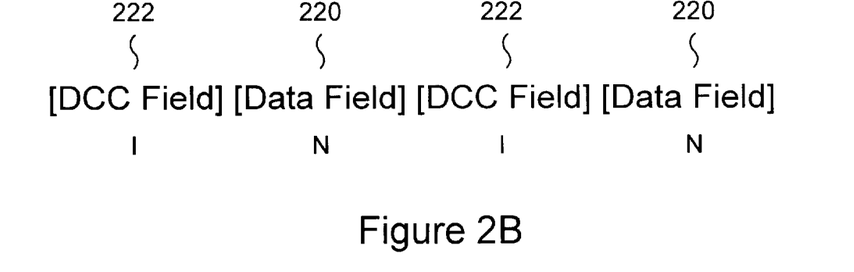
FIG. 2B is a diagram illustrating the data format produced by the DCC encoder and written to the channel.

FIG. 2B is a diagram illustrating the data format produced by the DCC encoder and written to the channel. Each data field 220 includes blocks of N multilevel data symbols. Each DCC field 222 includes one or more merge symbols. The merge symbols represent overhead associated with performing DCC. The block size N controls this overhead. If there is one merge symbol in each DCC field, then the overhead is 1/(N+1). As N increases, the overhead decreases. However, as N decreases, there is more control over the DC and low-frequency content of the final stream $b_k$.

Figure 3A:
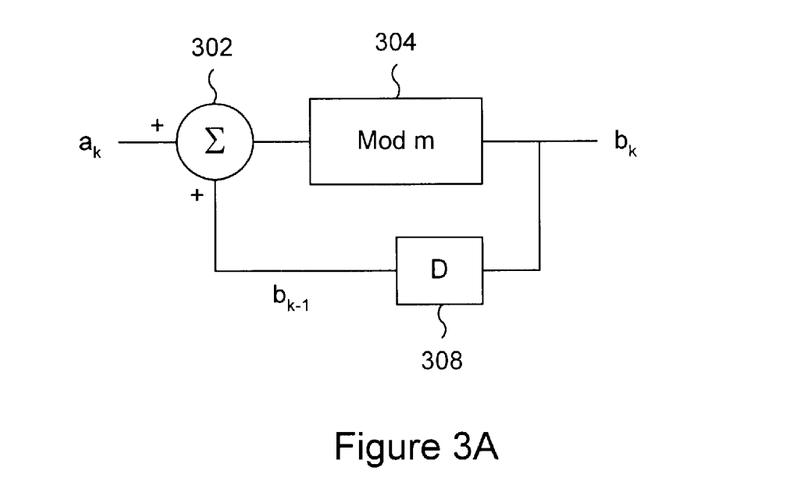
FIG. 3A is a block diagram illustrating a differential multilevel (DML) encoder.

FIG. 3A is a block diagram illustrating a differential multilevel (DML) encoder. A summer 302 adds the input symbol $a_k$ and a feedback signal $b_{k-1}$. A modulus m converter 304 restricts the summer output to a range between 0 and M−1. Modulus M converter 304 produces an output symbol $b_k$ that is written to the disc. A delay cell 308 feeds back the output symbol delayed by one time unit. The multilevel encoder shown is intended to write symbols to a channel that is equalized to unity, i.e., a zero-forcing channel. A differential multilevel decoder is used to decode the equalized output of the channel.

Figure 3B:
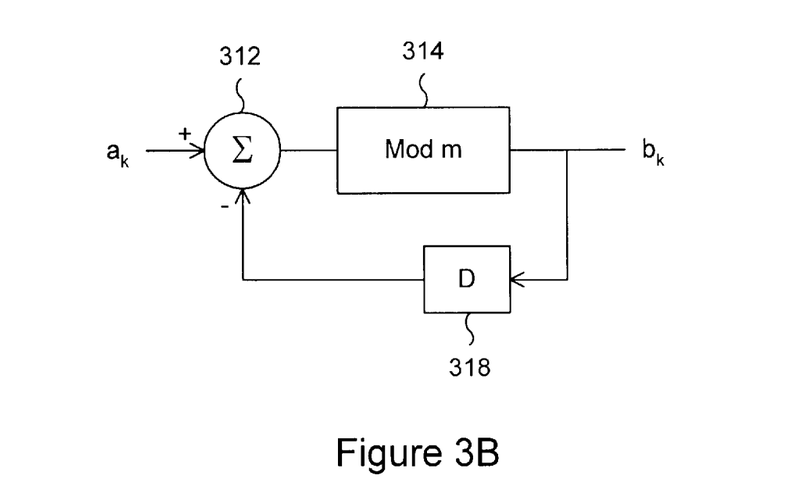
FIG. 3B is a block diagram illustrating a partial-response class 1 (PR1) precoder.

FIG. 3B is a block diagram illustrating a partial-response class 1 (PR1) precoder. The precoder is designed to write symbols to a channel that is equalized to 1+D, i.e., a PR1 channel, and a modulus M decoder. The PR1 precoder is the same as the differential encoder shown in FIG. 3A except for the sign of the delayed feedback signal. In different embodiments, other differential encoders with appropriate target channel responses and differential decoders are used.

Figure 4A:
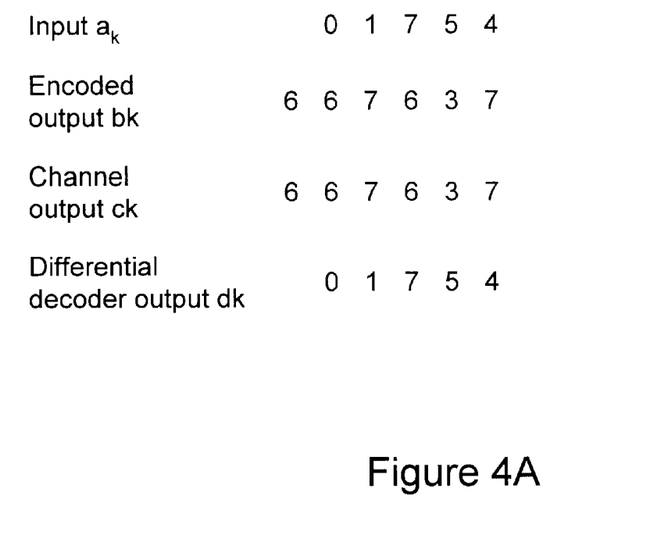
FIGS. 4A and 4B are diagrams illustrating example input and output symbol streams for the DML encoder and PR1 precoder, respectively.
Figure 4B:
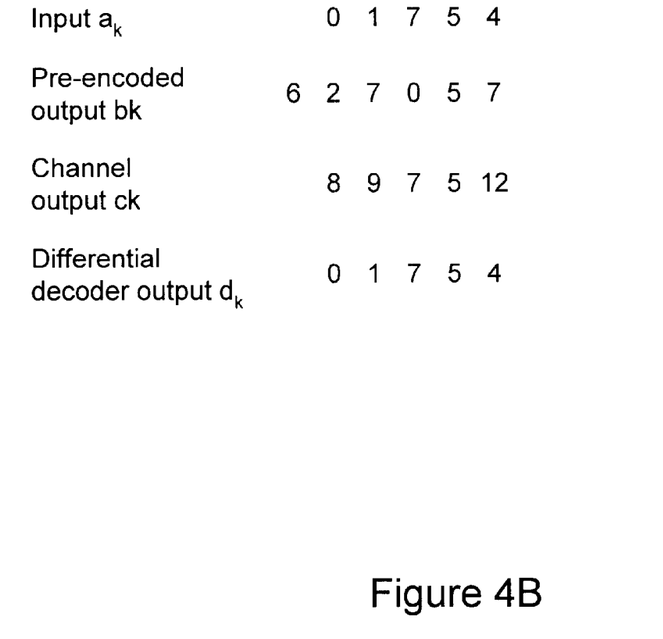

FIGS. 4A and 4B are diagrams illustrating example input and output symbol streams for the DML encoder and PR1 precoder, respectively. The output from the corresponding channels and from the corresponding differential decoders is also shown. In the example, we assume there are M=8 levels. The output $b_k$ of the DML encoder is given by:

$$b_k = a_k + b_{k-1} (\bmod M).$$

The DML encoder outputs symbols to a zero-forcing channel; therefore the channel output $c_k$ is given by:

$$c_k = b_k.$$

The DML decoder output dk, assuming no noise or errors, is given by:

$$d_k = c_k - c_{k-1} (\bmod M) = b_k - b_{k-1} (\bmod M) = a_k.$$

The output $b_k$ of the PR1 precoder is given by:

$$b_k = a_k - b_{k-1} (\bmod M).$$

The PR1 channel output ck is given by:

$$c_k = b_k + b_{k-1}.$$

The modulus-M decoder output $d_k$, assuming no noise or errors, is given by:

$$d_k = ck (\bmod M) = b_k + b_{k-1} (\bmod M) = a_k.$$

The DCC encoder selects and inserts merge symbols between blocks that limit the DC and low frequency energy of the read signal. The digital value (DV) of an M-ary symbol selected between 0 and M−1 is defined as:

$$DV(x) = 2*x - (M-1).$$

The digital sum value (DSV) of a block B of M-ary symbols is defined as:

$$DSV(B) = \Sigma DV(b_i); \ i=1 \text{ through } N$$

where $b_i$ are the symbols in block B and block B includes N symbols. The running digital sum (RDS) of a sequence at time k is the digital sum value from the first symbol of the sequence up to the kth symbol. In general, if the absolute value of the RDS grows large, then the sequence will have significant DC and low-frequency content. Likewise, if the RDS is always close to zero, then the sequence will have very little DC and low-frequency content. Consequently, the goal of the DCC encoder is to maintain a low absolute RDS throughout the sequence.

Given a new block of user data, the DCC encoder modifies the data or leaves the data unchanged depending on the current RDS, i.e., the RDS at the end of the previous block. For the first block the initial RDS is 0. The DCC encoder selectively inserts one of up to M different possible merge symbols. In some embodiments, RLL constraints or other constraints may cause certain merge symbols to be excluded from the set of possible merge symbols. For each possible merge symbol, the DCC encoder determines the resulting RDS of the new block after differential encoding. The DCC encoder then selects the possible merge symbol among all candidate merge symbols whose corresponding RDS satisfies a minimization criteria.

Finally, the merge symbol and block of user data passes through the differential encoder. In one embodiment, the minimization criteria is the absolute value of the RDS at the end of the block. In another embodiment, the minimization criteria is the largest absolute value of the RDS occurring within the block. Both minimization criteria associate a single number with each candidate merge symbol, which allows the comparison and selection process to be relatively simple. In other embodiments, other criteria are used. In some embodiments, a combination of criteria are used. For example, the two criteria described above may be combined and weighted to create a new criteria. The largest absolute value of the RDS occurring within the block is multiplied by a first weight and the absolute value of the RDS at the end of the block is be multiplied by a second weight. The sum of the two weighted values is the new criteria.

Figure 5A:
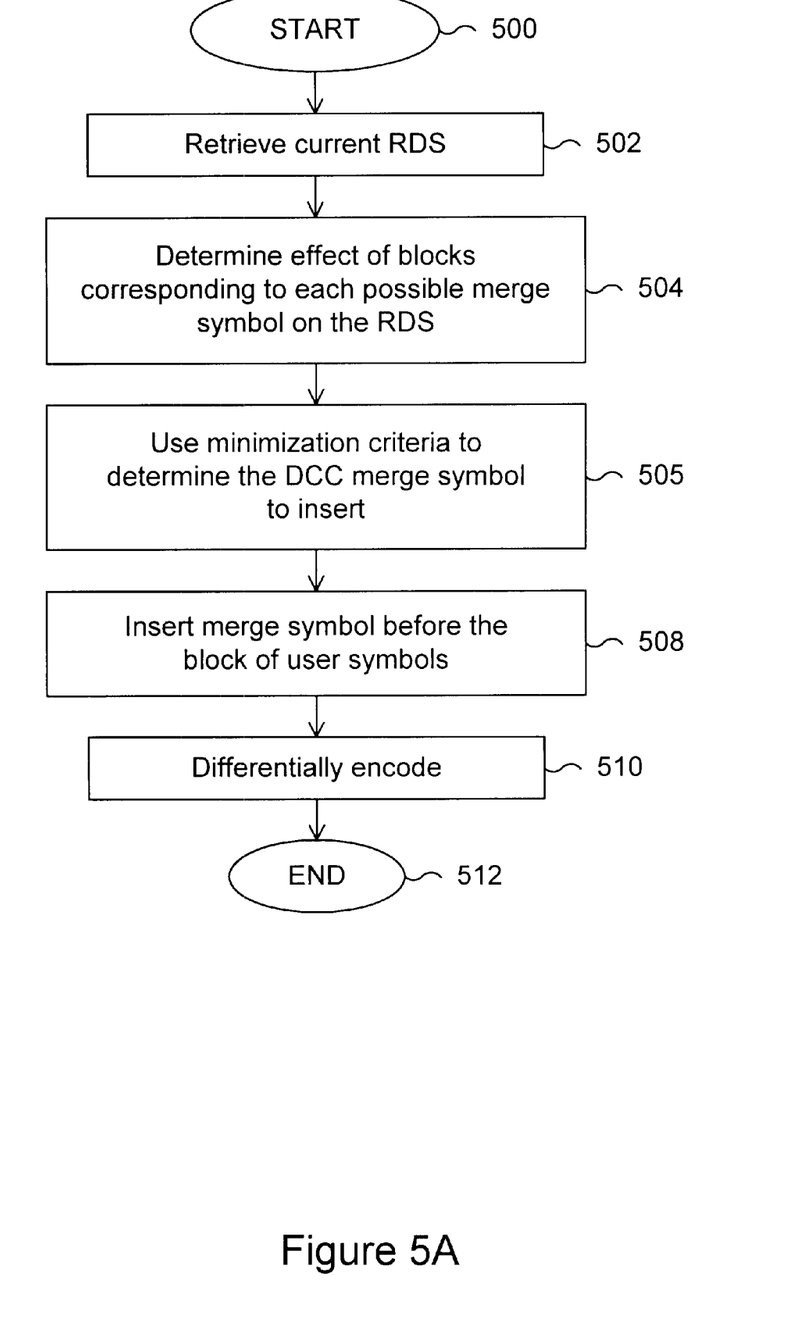
FIG. 5A illustrates the process for selecting and inserting a merge symbol during DCC encoding for a differentially encoded system.

FIG. 5A illustrates the process for selecting and inserting a merge symbol during DCC encoding for a differentially encoded system. The process starts at 500. In a step 502, the current RDS is either retrieved or calculated. Next, in a step 504, the effect of each block that corresponds to a possible merge symbol on the RDS is determined. Next, in a step 505, a minimization criteria is used to determine the DCC merge symbol to insert. The merge symbol is inserted in a step 508 before the next block of user symbols. The user symbols are differentially encoded along with the merge symbol in a step 510 and the process ends at 512.

Figure 5B:
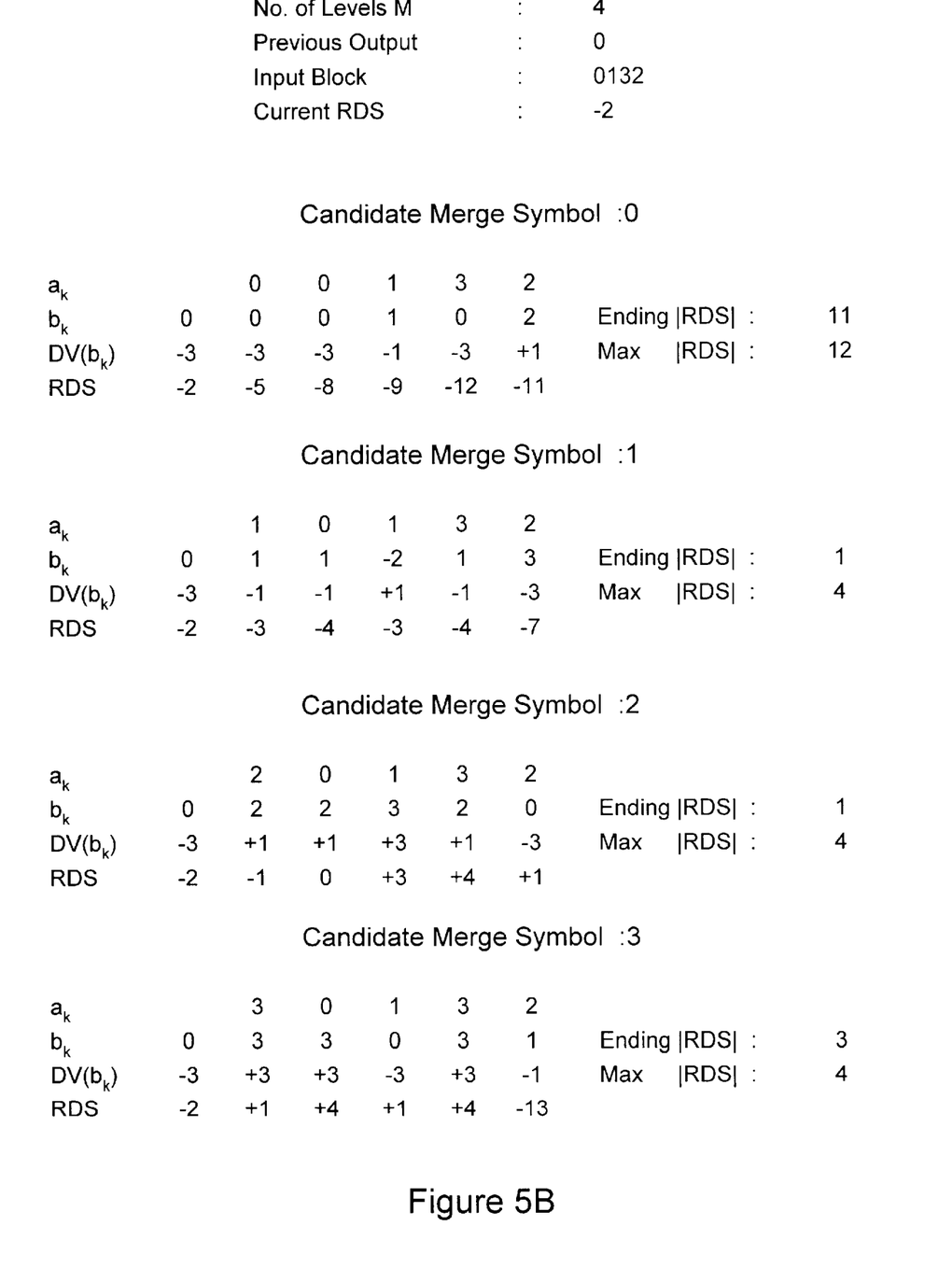
FIG. 5B is a diagram illustrating an example input block and candidate output blocks for the DML encoder corresponding to different merge symbols.

FIG. 5B is a diagram illustrating an example input block and candidate output blocks for the DML encoder corresponding to different merge symbols. Criteria for selecting the best merge symbol are also shown. In this example, M=4 levels. The input block is {0, 1, 3, 2}; the previous output level is 0; the current RDS is −2; and the digital values of symbols {0, 1, 2, 3} are {−3, −1, +1, +3}, respectively. Each merge symbol affects the precoder output sequence bits $b_k$ because differential encoding is used. As shown, the candidate merge symbols 0, 1, 2 and 3 result in ending absolute RDS values 11, 1, 1 and 3, respectively, and maximum absolute RDS values 12, 4, 4 and 4, respectively.

Candidate merge symbol 0 is the worst choice, independent of whether the ending absolute RDS value or the maximum RDS value is used as a criteria. Using the ending absolute RDS criteria, merge symbols 1 and 2 are the best choices. Using the maximum absolute RDS criteria, merge symbols 1, 2, or 3 are equally good choices. In different embodiments, either criteria may be used separately or a combination of the criteria may be used. In one embodiment, the maximum RDS is used as a primary criteria and the ending RDS is used as a secondary criteria. Thus, merge symbols 2, 3 and 4 would tie using the first criteria and merge symbols 2 and 3 would remain tied after the second criteria is applied. In one embodiment, the DCC breaks ties that persist after application of all criteria by selecting the symbol with the lowest DV.

Figure 6A:
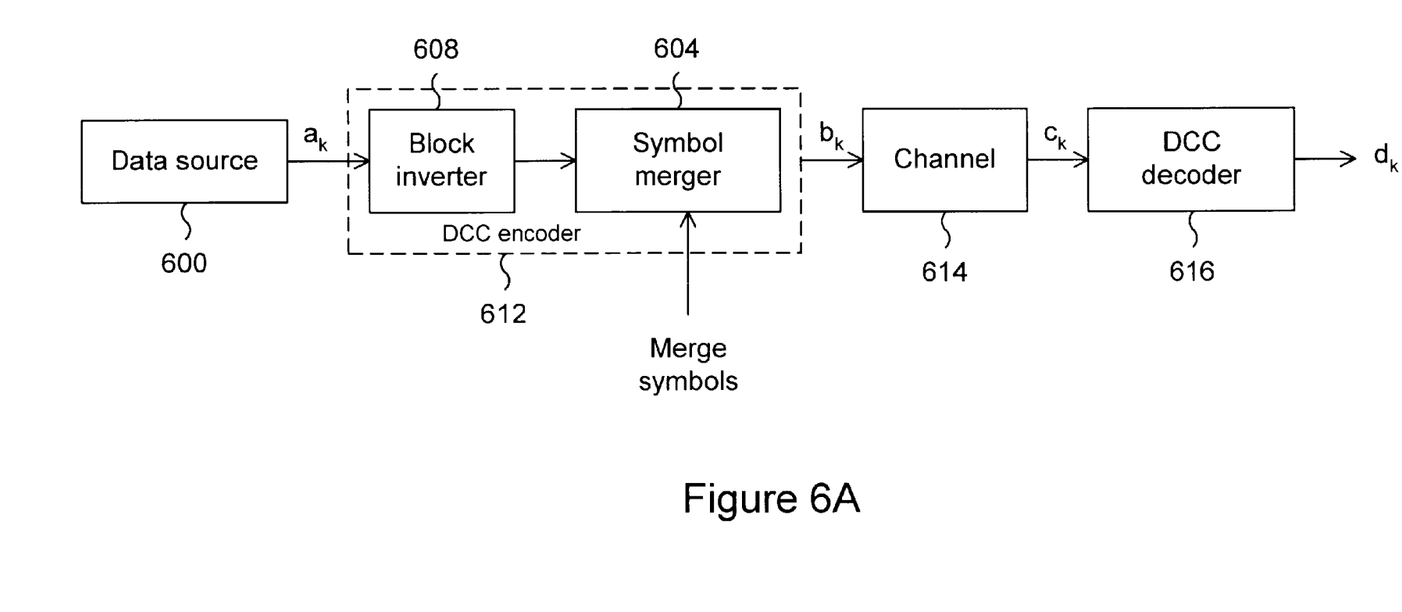
FIG. 6A is a block diagram of a non-differentially encoded system with DCC.

In another embodiment, DCC is implemented for a system that generates a non-differentially encoded multilevel signal. FIG. 6A is a block diagram of a non-differentially encoded system with DCC. A data source 600 provides a stream of multilevel symbols $a_k$ comprising a sector of data that is to be written to the disc. This data stream may be encoded using any appropriate multilevel encoding scheme. For example, a trellis encoder such as is described in U.S. patent application Ser. No. 09/369,746, filed Aug. 6, 1999, entitled "Coding System and Method for Partial Response Channels" which was previously incorporated by reference may be used to encode the data.

A symbol merger 604 divides the input sector into blocks of length N symbols and inserts a merge symbol in front of each block. In one embodiment, symbol merger 604 includes a multiplexer. A block inverter 608 selectively inverts blocks of data according to the merge symbol chosen to produce a stream of multilevel symbols $b_k$ that are written directly to the disk. Symbol merger 604 and block inverter 608 together comprise a DCC encoder 612. DCC encoder 612 selects the best merge symbol for providing DCC. It should be noted that the merge symbol does not pass through the block inverter. In contrast, in the differentially encoded system described above, the merge symbol passes through the differential encoder.

Channel 614 represents the combination of writing to and reading from the disk, as well as any accompanying analog and digital processing used to equalize the combined response to a zero-forcing target. Finally, a DCC decoder 616 inputs the channel output signal $c_k$ and converts it to a decoded signal $d_k$, which, in the absence of noise or other errors, is identical to the original signal $a_k$. Unlike the differentially encoded system merge symbols, the non-differentially encoded system merge symbols contain information, i.e., whether or not a block of data was inverted. The DCC decoder decodes the merge symbols and inverts data blocks accordingly.

Figure 6B:
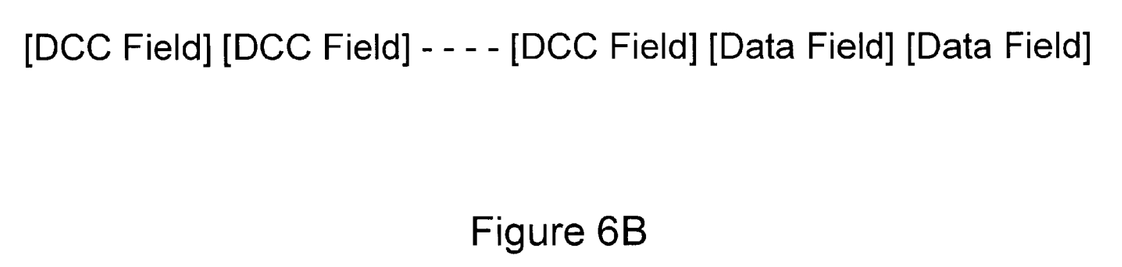
FIG. 6B is a diagram illustrating an alternative data format wherein all the DCC Fields for a sector are grouped together at the start, followed by all the Data Fields.

The data format produced by the DCC encoder and written to the channel can be the same as the data format of the differentially encoded system, as shown in FIG. 2B. FIG. 6B is a diagram illustrating an alternative data format wherein all the DCC Fields for a sector are grouped together at the start, followed by all the Data Fields. Since the DCC merge symbols do not pass through the block inverter, they do not have a direct effect on the DCC encoded output data symbols. That is, the DCC merge symbols do not change the DCC encoded output data symbols as a result of the merge symbols being inserted into the data stream. Instead, the DCC merge symbols simply instruct the DCC encoder to either invert or not invert certain blocks of data. Therefore, the DCC merge symbols need not be physically adjacent to the Data Fields, so long as the DCC encoder can receive the instructions contained in the merge symbols and apply the instructions at an appropriate time.

In an embodiment where merge symbols are inserted between blocks, the merge symbols affect the RDS in two ways. First, they enable data blocks to be selectively inverted by indicating whether or not each data block has been inverted. Also, the DSV of the merge symbol itself affects the RDS. Merge symbols are selected by the DCC encoder based on the current RDS, i.e., the RDS at the end of the previous block. Initially, the RDS is 0. The DCC encoder inserts a merge symbol corresponding to one of L different DCC levels.

For each candidate merge symbol, The DCC encoder determines the effect on the RDS of the new block. Half of the merge symbol candidates correspond to inverting the new block, and the other half correspond to not inverting the new block. The DCC encoder selects the candidate merge symbol that results in an RDS at the end of the new block that best satisfies a selected minimization criteria. The block of data is then inverted or not inverted according to the choice of merge symbol and the merge symbol is inserted. When the block of data is read, the merge symbol indicates whether the block of data has been inverted.

Figure 7A:
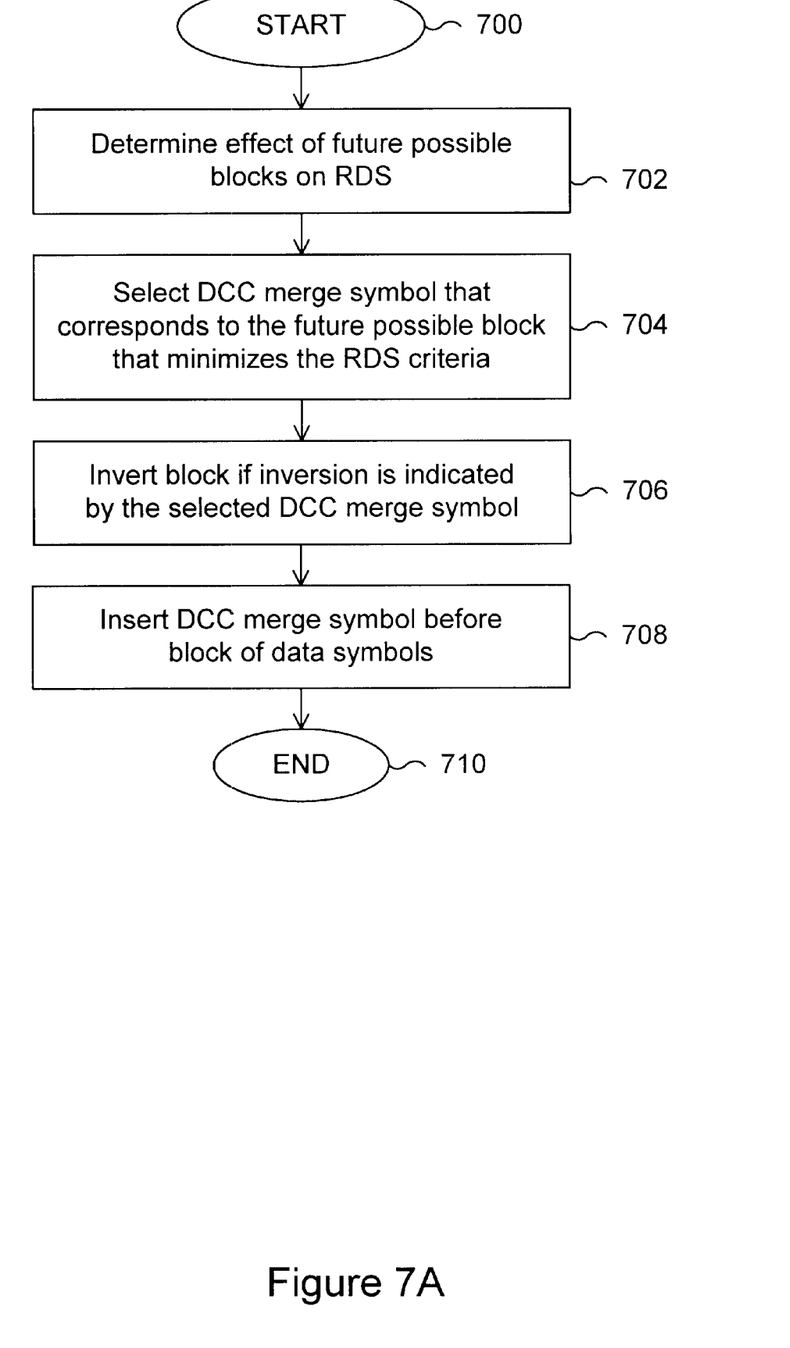
FIG. 7A is a flow chart illustrating a process for selecting and inserting a merge symbol during DCC encoding.

FIG. 7A is a flow chart illustrating a process for selecting and inserting a merge symbol during DCC encoding. The process starts at 700. In a step 702 the effect of future possible blocks corresponding to different merge symbols is determined by calculating RDS after such blocks. In a step 704, the DCC merge symbol is selected that corresponds to the future possible block that minimizes the RDS criteria. If the DC merge symbol is inserted next to the block, then the effect of the merge symbol is taken into account in calculating the RDS. In a step 706, if inversion is indicated by the selected DCC merge symbol, then the block is inverted. Finally, in a step 708, the DCC merge symbol is inserted before the block of data symbols. It should be noted that, in some embodiments, the DCC merge symbol may be inserted adjacent to the block of data and in some embodiments, the DCC merge symbol is inserted in a special area that is not necessarily adjacent to the block of data symbols corresponding to the DCC merge symbol. The process ends at 710.

For example, in a system with M=4 data levels and L=2 allowed DCC levels, merge symbol 0 can be assigned to represent not inverting, and merge symbol 3 (symbol M−1) can be assigned to represent inverting. When L=4 and M=4, merge symbols 0 and 3 can be assigned to represent not inverting, and merge symbols 2 and 1 can be assigned to represent inverting. When L=3 and M=3, merge symbols 0 and 2 can be assigned to represent not inverting, and merge symbol 1 can be assigned to represent inverting. Defining inverting and noninverting symbols to be interleaved in this manner, facilitates selecting a merge symbol of a given type that also has a DSV that further reduces the RDS when the merge symbol is included next to a block.

Figure 7B:
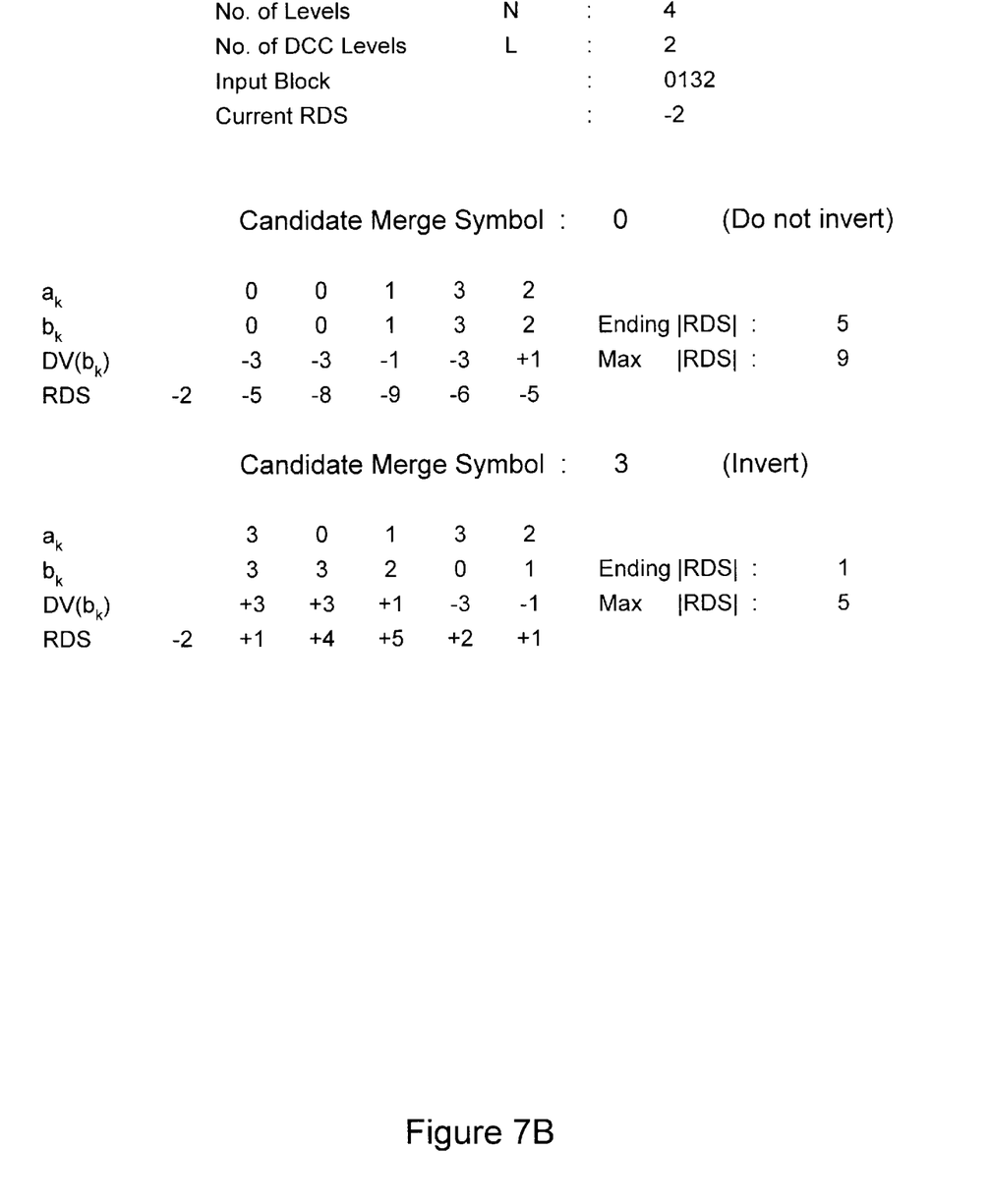
FIG. 7B is a diagram illustrating an example input block and candidate output blocks for a DCC encoder when M=4 and L=2.

FIG. 7B is a diagram illustrating an example input block and candidate output blocks for a DCC encoder when M=4 and L=2. Maximum ending RDS and maximum RDS within the block are also shown for the candidate output blocks as sample criteria used to select the best merge symbol. This example uses a data format that includes alternating DCC and Data Fields, so the DSV of the merge symbol also affects the RDS. The input block is {0, 1, 3, 2 } and the current RDS is −2. The digital values of symbols 0, 1, 2, and 3 are −3, −1, +1, and +3, respectively. The candidate merge symbols 0 and 3 result in ending absolute RDS values of 5 and 1 and maximum absolute RDS values of 9 and 5, respectively. Candidate merge symbol 3 (which corresponds to an inverted block) is shown to be superior using either minimization criteria.

In general, a higher L results in better DCC, since a greater number of symbols may be selected that either invert or do not invert the data block and the increased choice among inverting and noninverting symbols enables the RDS to be beneficially affected by the symbol choice as well as the inversion or non-inversion of the next data block. However, as N increases and the blocks become very large, the effect of the merge symbols on the RDS is less important and the difference in performance as L increases is marginal.

As L increases, there is a higher probability of decoding the merge symbols incorrectly. Very few errors may occur when distinguishing between the lowermost level (level 0) and the uppermost level (level M−1) in an M level multilevel system. However, when intermediate levels such as 1 and M−2, which are not separated as much as the upppermost and lowermost levels, are also potential merge symbols, increased errors can result.

Errors that occur in decoding a single DCC merge symbol are particularly harmful because a single DCC merge symbol read error causes an entire block to be decoded in error. That is, the wrong decision may be made to either invert or not invert the block, causing every symbol in the block to be wrong when the inversion decision is wrong. The possibility of incorrectly interpreting an entire data block as a result of a single mistake in interpreting a DCC merge symbol is a weakness of the block-inversion DCC scheme for non-differential encoding. Such a problem does not occur for differential encoding. Therefore, it is important to protect the merge symbols from errors. Therefore, in one preferred embodiment, only the lowermost level (level 0) and the uppermost level (level M−1) symbols are used as DCC merge symbols so that errors are minimized.

Figure 7C:
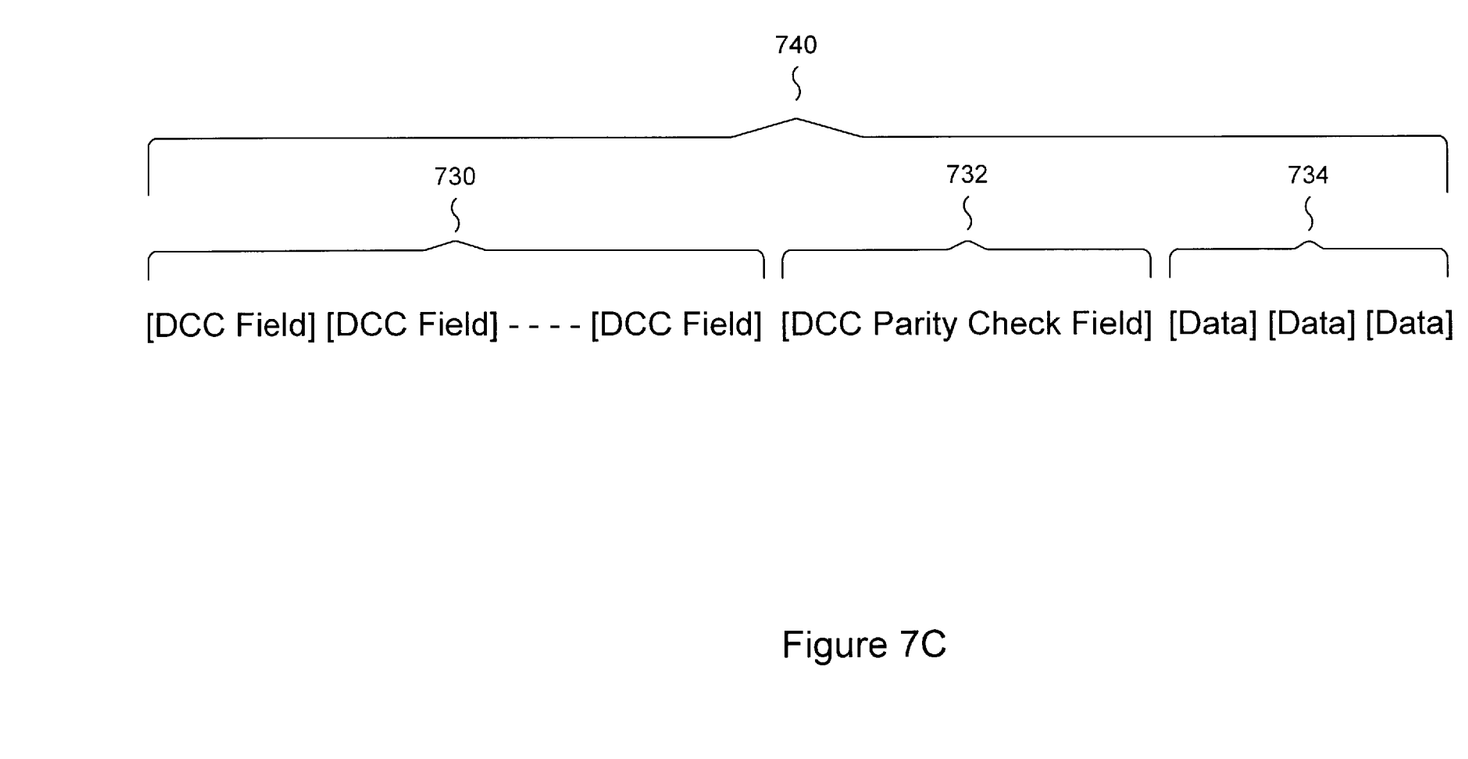
FIG. 7C is a diagram illustrating a data format that includes all the DCC Fields for a sector of data grouped together before at the start of the sector, followed by a DCC Parity-Check Field for the ECC.

Errors may be prevented in interpreting the merge symbols by using an appropriate error correction code (ECC) on the DCC merge symbols themselves. FIG. 7C is a diagram illustrating a data format that includes all the DCC Fields 730 for a sector of data 740 grouped together before at the start of the sector, followed by a DCC Parity-Check Field 732 for the ECC. A set of data fields 734 follow DCC Parity-Check Field 732 and are grouped together at the end of the sector.

For either differential or non-differential encoding, the methods of achieving DCC described above do not guarantee that the RDS at the end of a sector will be zero. A residual RDS, although small in absolute value because of the DCC, may build up over multiple sectors and interfere with the servo-motor controls. In one embodiment, to avoid the build up of the RDS over multiple sectors, a clean up field is added at the end of each sector to zero out the residual RDS. The clean up field can be small because the expected residual RDS is small. Therefore, the clean up field does not significantly increase overhead, even in a system in which the sectors are small.

Figure 8A:
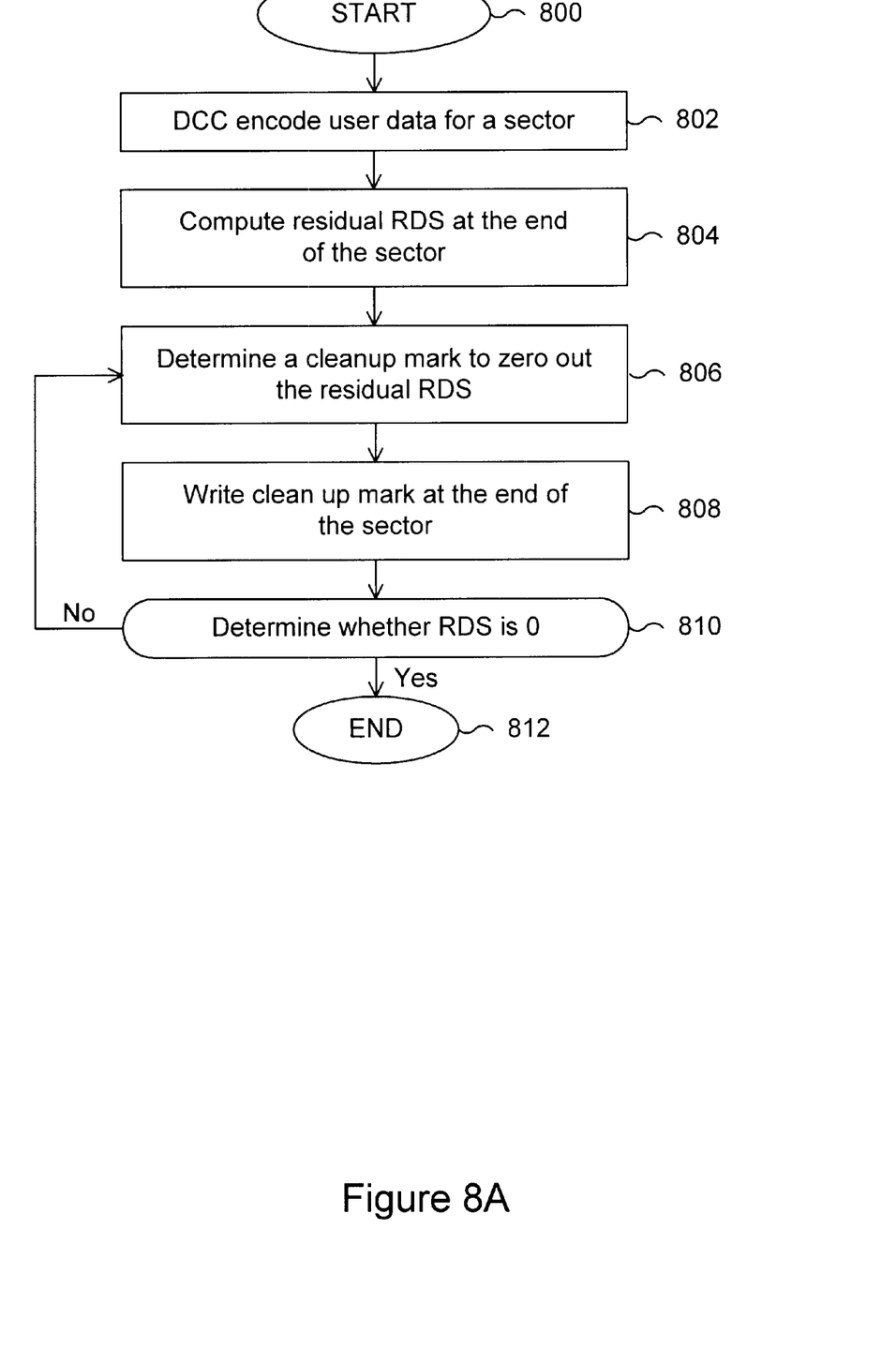
FIG. 8A is a flow chart illustrating a process for determining and adding clean up marks.

FIG. 8A is a flow chart illustrating a process for determining and adding clean up marks. The process starts at 800. In a step 802, user data is DCC encoded for a sector. Next, in a step 804, the residual RDS at the end of the sector is determined. Next, in a step 806, a cleanup mark is determined for the purpose of zeroing out the residual RDS. It chooses the symbol that brings the absolute value of the RDS as close to zero after the mark. In a step 808, the cleanup mark is written to the disc. In a step 810, it checks if the residual RDS is now zero. If the residual RDS after writing the cleanup mark is not zero, then it returns back to step 806 to choose another clean-up mark. If the residual RDS is zero, then the process ends in a step 812.

Figure 8B:
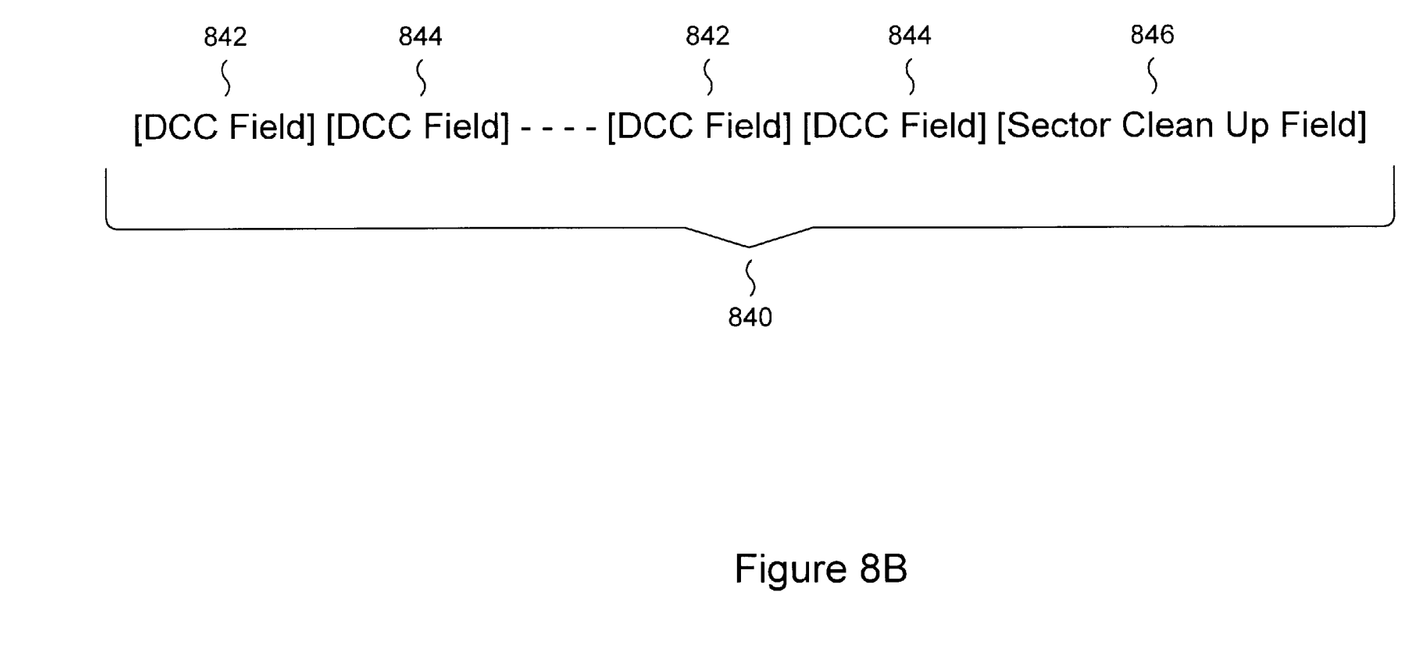
FIG. 8B shows the data format for a sector that includes a clean up field.

FIG. 8B shows the data format for a sector 840 that includes a clean up field. Sector 840 includes alternating DCC fields 842 and data fields 844 and a clean up field 842 at the end of the sector. The DCC fields keep the RDS at the end of the sector relatively small using one of the techniques described above. The small residual RDS is canceled out by the DSV of the symbols in the clean up field.

Techniques for reducing DC and low frequency components of a read signal have been disclosed for a multilevel optical storage system. In one embodiment, differential encoding is used and merge symbols are included between data blocks. The merge symbols are selected according to a minimization criteria that limits the RDS of the read symbols. In another embodiment, nondifferential encoding is used and merge symbols may be included that control whether data blocks are inverted. The DSV of the merge symbols may also contribute to controlling the RDS. An error correction code may be applied to the merge symbols to reduce the probability of incorrectly interpreted merge symbols causing wrong inversion decisions to be applied to entire data blocks. At the end of each sector, a clean up field may also be added to zero out any remaining RDS with the DSV of the clean up field.

Although the foregoing invention has been described in some detail for purposes of clarity of understanding, it will be apparent that certain changes and modifications may be practiced within the scope of the appended claims. It should be noted that there are many alternative ways of implementing both the process and apparatus of the present invention. Accordingly, the present embodiments are to be considered as illustrative and not restrictive, and the invention is not to be limited to the details given herein, but may be modified within the scope and equivalents of the appended claims.

What is claimed is:

1. A method of writing a multilevel data sequence to a storage medium so that a read signal generated by reading the multilevel data sequence from the storage medium will have reduced low frequency content comprising:

evaluating the effect of a plurality of candidate merge symbols on an RDS of the read signal;

selecting a preferred merge symbol from among the plurality of candidate merge symbols based on the effect of the preferred merge symbol on an RDS of the read signal; and adding the preferred merge symbol to the multilevel data sequence so that the RDS of the read signal is controlled.

2. A method of writing a multilevel data sequence to a storage medium as recited in claim 1 wherein selecting a preferred merge symbol from among the plurality of candidate merge symbols based on the effect of the preferred merge symbol on an RDS of the read signal includes minimizing the RDS of the read signal at a given point.

3. A method of writing a multilevel data sequence to a storage medium as recited in claim 1 wherein selecting a preferred merge symbol from among the plurality of candidate merge symbols based on the effect of the preferred merge symbol on an RDS of the read signal includes minimizing the RDS of the read signal at a given set of points.

4. A method of writing a multilevel data sequence to a storage medium as recited in claim 1 wherein the effect of a plurality of candidate merge symbols on an RDS of the read signal is evaluated at the end of a block.

5. A method of writing a multilevel data sequence to a storage medium as recited in claim 1 wherein the effect of a plurality of candidate merge symbols on an RDS of the read signal is evaluated at every point within a block.

6. A method of writing a multilevel data sequence to a storage medium as recited in claim 1 wherein the multilevel data sequence and the preferred merge symbol are differentially encoded.

7. A method of writing a multilevel data sequence to a storage medium as recited in claim 1 wherein the preferred merge symbol indicates whether a block of data has been inverted.

8. A method of writing a multilevel data sequence to a storage medium as recited in claim 7 wherein the candidate merge symbols include interleaved inverting and noninverting merge symbols.

9. A method of writing a multilevel data sequence to a storage medium as recited in claim 7 wherein the preferred merge symbol is written next to the block of data.

10. A method of writing a multilevel data sequence to a storage medium as recited in claim 7 wherein the preferred merge symbol is written in a region that is not located adjacent to the block of data and wherein the region includes other preferred merge symbols.

11. A method of writing a multilevel data sequence to a storage medium as recited in claim 10 wherein the region further includes an error correction code for the preferred merge symbols.

12. A method of writing a multilevel data sequence to a storage medium as recited in claim 1 further including adding a cleanup symbol to the multilevel data sequence for the purpose of reducing the RDS to zero at the end of a sector.

13. A DC control encoder in a system for writing a multilevel data sequence to a storage medium comprising:

a processor configured to evaluate the effect of a plurality of candidate merge symbols on an RDS of the read signal and to select a preferred merge symbol from among the plurality of candidate merge symbols based on the effect of the preferred merge symbol on an RDS of a read signal;

a bit merger configured to add the preferred merge symbol to the multilevel data sequence so that the RDS of the read signal is controlled;

whereby the read signal generated by reading the multilevel data sequence from the storage medium will have reduced low frequency content.

14. A DC control encoder in a system for writing a multilevel data sequence to a storage medium as recited in claim 13 wherein the processor is further configured to select a preferred merge symbol from among the plurality of candidate merge symbols based on the effect of the preferred merge symbol on an RDS of the read signal includes minimizing the RDS of the read signal at a given point.

15. A DC control encoder in a system for writing a multilevel data sequence to a storage medium as recited in claim 13 wherein the processor is further configured to select a preferred merge symbol from among the plurality of candidate merge symbols based on the effect of the preferred merge symbol on an RDS of the read signal includes minimizing the RDS of the read signal at a given set of points.

16. A DC control encoder in a system for writing a multilevel data sequence to a storage medium as recited in claim 13 wherein the processor is further configured to evaluate the effect of a plurality of candidate merge symbols on an RDS of the read signal at the end of a block.

17. A DC control encoder in a system for writing a multilevel data sequence to a storage medium as recited in claim 13 wherein the processor is further configured to evaluate the effect of a plurality of candidate merge symbols on an RDS of the read signal at every point within a block.

18. A DC control encoder in a system for writing a multilevel data sequence to a storage medium as recited in claim 13 further including a differential encoder that differentially encodes the multilevel data sequence and the preferred merge symbol.

19. A DC control encoder in a system for writing a multilevel data sequence to a storage medium as recited in claim 13 wherein the preferred merge symbol indicates whether a block of data has been inverted.

20. A DC control encoder in a system for writing a multilevel data sequence to a storage medium as recited in claim 19 wherein the candidate merge symbols include interleaved inverting and noninverting merge symbols.

21. A DC control encoder in a system for writing a multilevel data sequence to a storage medium as recited in claim 19 wherein the preferred merge symbol is written next to the block of data.

22. A DC control encoder in a system for writing a multilevel data sequence to a storage medium as recited in claim 19 wherein the preferred merge symbol is written in a region that is not located adjacent to the block of data and wherein the region includes other preferred merge symbols.

23. A DC control encoder in a system for writing a multilevel data sequence to a storage medium as recited in claim 22 wherein the region further includes an error correction code for the preferred merge symbols.

24. A DC control encoder in a system for writing a multilevel data sequence to a storage medium as recited in claim 13 wherein the bit merger is further configured to add a cleanup symbol to the multilevel data sequence for the purpose of reducing the RDS to zero at the end of a sector.

25. A storage medium with multilevel data written to the storage medium so that a read signal generated by reading the multilevel data sequence from the storage medium has a reduced low frequency content wherein the multilevel data sequence was written by:

evaluating the effect of a plurality of candidate merge symbols on an RDS of the read signal;

selecting a preferred merge symbol from among the plurality of candidate merge symbols based on the effect of the preferred merge symbol on an RDS of the read signal; and adding the preferred merge symbol to the multilevel data sequence so that the RDS of the read signal is controlled.

* * * * *